(12) United States Patent
Genik

(10) Patent No.: US 9,065,402 B2
(45) Date of Patent: Jun. 23, 2015

(54) APPARATUS AND METHOD FOR AMPLIFYING A SIGNAL FROM A TRANSMITTER

(75) Inventors: Anatoly Genik, Kfar Saba (IL); Svetlana Kantor, legal representative, Kfar Saba (IL)

(73) Assignee: DSP GROUP LTD., Herzeliya (IL)

( * ) Notice: Subject to any disclaimer, the term of this patent is extended or adjusted under 35 U.S.C. 154(b) by 21 days.

(21) Appl. No.: 13/807,933

(22) PCT Filed: Jul. 5, 2010

(86) PCT No.: PCT/IL2010/000538
§ 371 (c)(1),
(2), (4) Date: Mar. 20, 2013

(87) PCT Pub. No.: WO2012/004781
PCT Pub. Date: Jan. 12, 2012

(65) Prior Publication Data
US 2013/0215995 A1    Aug. 22, 2013

(51) Int. Cl.
*H04L 27/00* (2006.01)
*H03G 3/00* (2006.01)
*H03F 1/22* (2006.01)
*H03F 3/217* (2006.01)
*H03F 3/24* (2006.01)

(52) U.S. Cl.
CPC ............ *H03G 3/00* (2013.01); *H03F 1/223* (2013.01); *H03F 3/2176* (2013.01); *H03F 3/245* (2013.01); *H03F 2200/18* (2013.01)

(58) Field of Classification Search
CPC ....... H03F 1/223; H03F 1/2176; H03F 1/245; H03F 2200/18; H03G 3/00
USPC ........ 375/295, 296, 297; 455/63.1, 67.13, 69, 455/114.3, 127.1, 522; 330/149, 253, 254, 330/278, 284, 285, 296; 327/306, 563
See application file for complete search history.

(56) References Cited

U.S. PATENT DOCUMENTS

| | | | |
|---|---|---|---|
| 7,084,704 B2* | 8/2006 | Sowlati | 330/253 |
| 7,362,179 B2* | 4/2008 | Liu et al. | 330/296 |
| 7,471,941 B2* | 12/2008 | Dauphinee et al. | 455/334 |
| 7,714,658 B1* | 5/2010 | Striflier | 330/284 |

* cited by examiner

*Primary Examiner* — Leon Flores
(74) *Attorney, Agent, or Firm* — Oren Reches

(57) ABSTRACT

The subject matter discloses a method of amplifying a signal, the method comprising receiving a command to start transmission, gradually increasing a value of an enable signal used to amplify the transmission and intermittently transmitting the value of the enable signal to an enable transistor used to allow amplifying a transmitted signal.

18 Claims, 4 Drawing Sheets

PRIOR ART

APPARATUS AND METHOD FOR AMPLIFYING A SIGNAL FROM A TRANSMITTER

BACKGROUND OF THE INVENTION

1. Field of the Invention

The present invention relates to amplifying a signal in general and to amplifying a signal using ramping in particular.

2. Discussion of the Related Art

High quality radio frequency (RF) signals must ramp quickly from a condition of minimal output power to a condition of information-bearing modulation at a specified output power and back down to the condition of minimal output power. Such power ramping capability is required for transmitters in many Time Division Multiple Access (TDMA) communication systems and other transmitters. Examples to such TDMA systems include those specified by the DECT, GSM and ansi-136 standards, and combinations of the same.

A fundamental requirement of these transmitters is that the acts of ramping up and ramping down must not violate specified limits on peak power in spectral bands away from the assigned RF channel. Such bands would be allocated to other transmitters. The associated measurement is called the transient spectrum in some systems or the transient adjacent channel power (transient ACP) in others.

In many cases, E class amplifiers comprise two transistors connected serially, to form a widely used cascode cell. In many cases, amplifier input signal is such the AC amplitude is higher than the DC amplitude, which makes difficult to disable the transmission. To achieve the disabling, the voltage value of the DC should be negative, which requires additional hardware modules, such as negative voltage generator.

FIG. 1A shows a graph of voltage provided to the amplifying unit, in accordance with an exemplary embodiment of a prior art transmitter. The normal operation DC voltage 110 is 0.5 to 0.7 volts, and the AC voltage 120 has amplitude of 1 volt or higher. The standard threshold voltage of the amplifier is about 0.5 to 0.7 v, which means that the DC voltage is required, to disable the amplification, has to be negative, such as negative DC voltage 130.

It is desired to provide a transmitter having an amplifying unit that avoids the requirement for negative power.

SUMMARY OF THE PRESENT INVENTION

The subject matter discloses a method of amplifying a signal, the method comprising receiving a command to start transmission and gradually increasing a value of an enable signal used to amplify the transmission. The method also comprises intermittently transmitting the value of the enable signal to an enable transistor used to allow amplifying a transmitted signal.

In some cases, the method further comprises a step of generating a trapezoid signal used to gradually increase the value of the enable signal.

In some cases, the method further comprises a step of converting a square signal into the trapezoid signal. In some cases, the trapezoid signal is received at the enable transistor. In some cases, the transmitted value is an impedance value.

It is another object of the subject matter to disclose a transmission unit, comprises an amplifying module. The amplifying module comprising: a common source transistor and an enable transistor used to allow transmission of signals from the transmission unit. The enable transistor receives a gradually increased signal in an intermittent manner.

In some cases, the transmission unit further comprising a mechanism for generating a trapezoid signal used to gradually increase the signal;

In some cases, the transmission unit further comprising a mechanism for converting a square signal into the trapezoid signal.

In some cases, the mechanism comprises a reverse counter for detecting signals received from a control unit and an accumulator for summing the number of detected signals. In some cases, the detected signals are selected from a group consisting of enable and disable signals.

BRIEF DESCRIPTION OF THE DRAWINGS

Exemplary non-limited embodiments of the disclosed subject matter will be described, with reference to the following description of the embodiments, in conjunction with the figures. The figures are generally not shown to scale and any sizes are only meant to be exemplary and not necessarily limiting. Corresponding or like elements are optionally designated by the same numerals or letters.

DETAILED DESCRIPTION OF THE PREFERRED EMBODIMENT

One technical challenge disclosed in the subject matter is to provide disabling of an amplifying unit without the need to send a negative voltage signal to the amplifying unit. Another technical problem is to reduce the amount of bandwidth required when the transmitted signal increased too rapidly.

One technical solution of the disclosed subject matter is to provide gradual amplification to a transmitter using ramping technology. This may be achieved by providing a trapezoid signal from an enable module of a transmitter, used to enable transmission, to an amplifying unit.

Figure 1A:
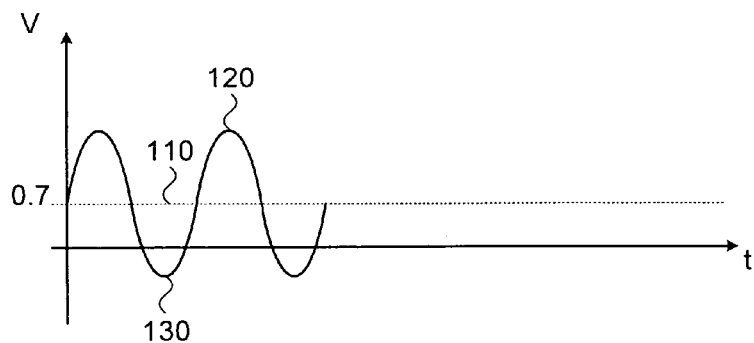
FIG. 1A shows a graph of voltage provided to the amplifying unit, in accordance with an exemplary embodiment of a prior art transmitter.
Figure 1B:
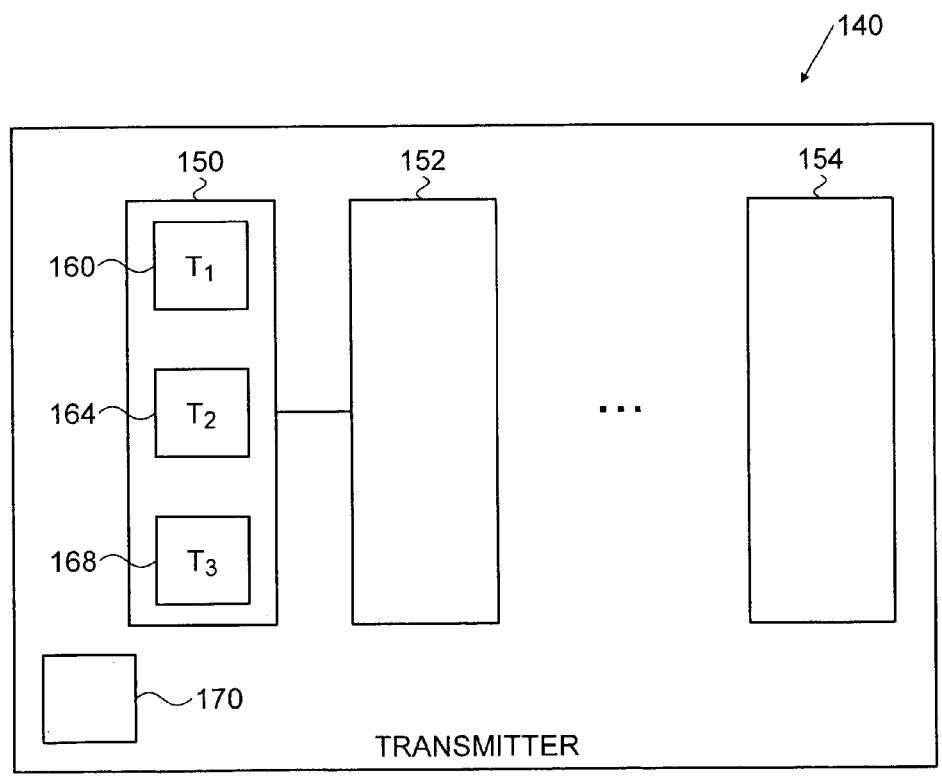
FIG. 1B shows a transmitter using a ramping technique, according to exemplary embodiments of the subject matter.

FIG. 1B shows a transmitter using a ramping technique, according to exemplary embodiments of the subject matter. The transmitter 140 comprises one or more amplifying modules, such as 150, 152 and 154. The one or more amplifying modules may be connected in parallel. In some exemplary cases, each of the one or more amplifying modules comprises three transistors. For example, amplifying module 150 comprises a common source transistor 160, a common gate transistor 168 and an enabling transistor 164.

The common source transistor 160 functions as a voltage amplifier, in which input voltage modulates the amount of current flowing through the transistor and changes the voltage across the output resistance according to Ohm's law. The combination of both the common source transistor 160 and the common gate transistor 168 forms a cascode cell. The cascode cell has several well known advantages and is widely used. The common gate transistor 168 is optional in the amplifying module 150 and is not an integral module within said amplifying module 150.

While prior art enabling transistors provide a binary control for enabling the signal in the amplifier, which results in immediate start of transmission. The enabling transistor of the disclosed subject matter provides a gradually increased signal that provides a precise control on the pace of increased and decreased power outputted from an amplifying module, such as 150. The gradually increased voltage may be provided in multiple techniques, as detailed below.

Figure 2:
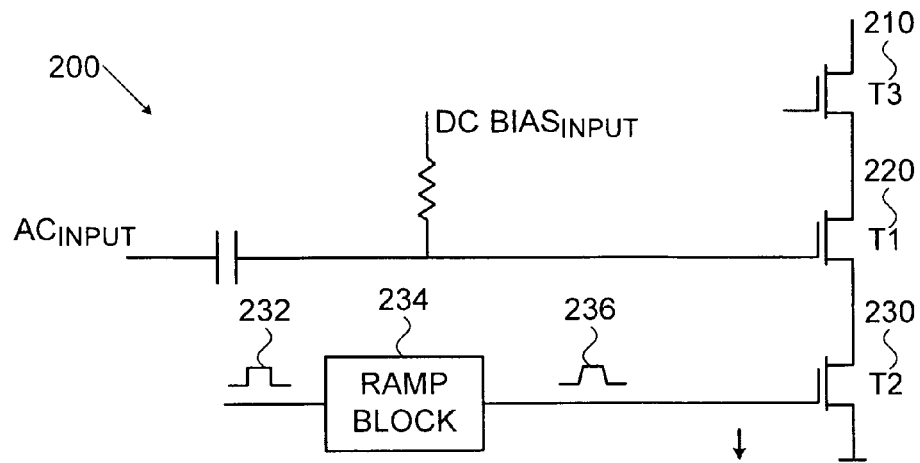
FIG. 2 shows an amplifying module using a ramping technique, according to exemplary embodiments of the subject matter.

FIG. 2 shows an amplifying module using a ramping technique, according to exemplary embodiments of the subject matter. The amplifying module 200 comprises a common gate transistor 210 and a common source transistor 220 operating to amplify a signal to be transmitted. The amplifying module 200 further comprises an enable transistor 230, changing its impedance according to a signal. The impedance provided from the enable transistor 230 to the common source transistor 220 is provided in a non-binary manner, for example a trapezoid signal comprising intermediate values other than zero and the maximal level. The common source transistor 220 may receive an AC signal via a capacitor and a DC bias signal via a resistor.

The trapezoid impedance presented by the enable transistor 230 provides for gradual conductivity of the common source transistor 220 as a function of the voltage provided to the enable transistor 230. For example, over a period of 0.1 seconds, the impedance provided from the enable transistor 230 to the common source transistor 220 gradually increased from 0Ω to 2.5Ω. Such gradual increase may be in intermediate values of 0.05Ω, for example providing 0.05Ω, 0.1Ω, 0.15Ω and the like. Providing the common source transistor 220 with intermediate levels of impedance results in gradual increase in the amplified signal outputted from the transmitter. For example, when providing impedance level of substantially zero, the enable transistor enable amplifying the signal, as no resistance is provided. As the resistance is increased, for example 100 kΩ, amplifying the signal using the common source transistor 220 is disabled as the voltage on the enable transistor is approximately zero. Further, gradual indication as to whether transmission should begin, as provided by the gradual impedance from the enable transistor 230 requires less bandwidth than required when sending a YES/NO indication as provided in prior art transmitters.

In some exemplary embodiments of the disclosed subject matter, the enable transistor 230 receives a command from a control unit, such as 170 of FIG. 1B. The control unit may send a pulse used to gradually increase the impedance outputted from the enable transistor 230. Alternatively, the data from the control unit may be received at a ramping unit such as 234, used to convert the data from the control unit as a trapezoid voltage or gradually increased voltage to the enable transistor 230. Alternatively, the ramping unit may reside within the enable transistor 230. In such case, the enable transistor 230 receives a square signal such as signal 232 and outputs trapezoid impedance such as signal 236.

In some cases, a transmitter may comprise several common source transistors; each common source transistor is connected to a specific enable transistor. Several common source transistors, such as 220, may be connected to one common gate transistors in parallel.

Figure 3:
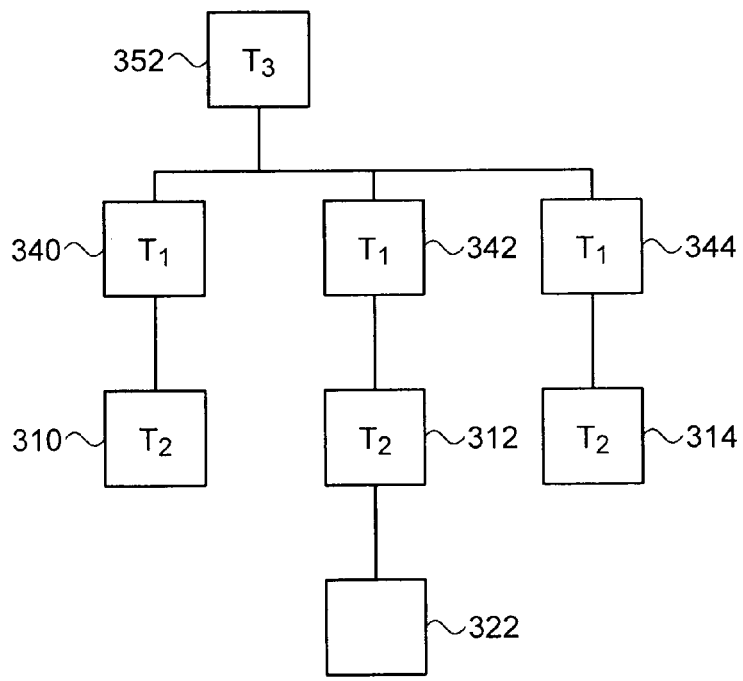
FIG. 3 shows a transmitter utilizing a gradually adjusted impedance, according to exemplary embodiments of the subject matter.

FIG. 3 shows a transmitter utilizing a gradually adjusted impedance, according to exemplary embodiments of the subject matter. The transmitter provides a configuration, according to which a specific enable transistor is not related to a specific amplifying unit as described in FIG. 1B. Transmitter 300 comprises multiple enable transistors, such as 310, 312 and 314. Each of the enable transistors receives a signal from a control unit. In some embodiments, each enable transistor receives a signal from a different control unit. Alternatively, several enable transistors receive a signal from the same control unit. The signal from the control unit may be 0 or 1, or another square wave implementation. The signal may be converted to a trapezoid impedance by a ramping unit connecting the control unit 322 and the enable transistor 312.

The transmitter 300 further comprises one or more common source transistors, such as 340, 342 and 344. In some exemplary cases, each common source transistor is connected to a specific enable transistor and receives an enable indication from the specific enable transistor, an indication that controls the amplifying of data transmitted from the transmitter 300. A sequence of common source transistor and an enable transistor are connected in series. Each pair of a common source transistor and an enable transistor is connected in parallel to another pair. While prior art transmitters used a square wave indication from the enable transistor to the transistor controlling the amplifying, the subject matter provides for an indication impedance having two or more levels of signals. Such impedance may be resistance values, such as 10 ohms, 20 ohms, 30 ohms such that the impedance is increased gradually during a period of time in which a sequence of impedance values are provided from the enable transistor to the common source transistor. Such sequence of impedance values may be the gradual indication of amplifying the transmission, or an indication concerning start of transmission. The transmitter 300 may also comprise one or more common gate transistors 352, connected in series to the parallel array of pairs of common source transistor and an enable transistor. For example, a first pair comprises enable transistor 310 and common source transistor 340 and a second pair comprises enable transistor 312 and common source transistor 342. Common gate transistor 352 is connected in series to the parallel connection of first pair and the second pair.

Figure 4:
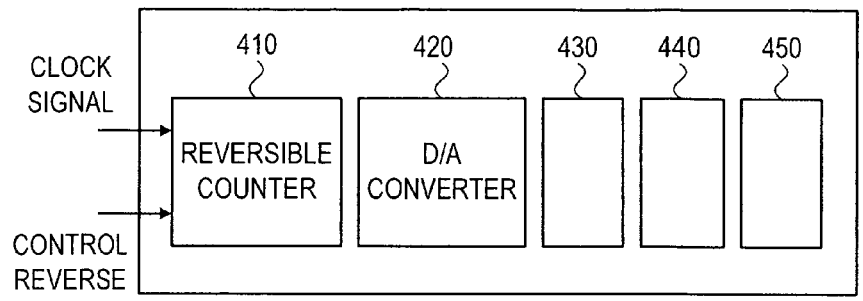
FIG. 4 shows a mechanism for generating a gradually adjusted impedance, according to exemplary embodiments of the subject matter.

FIG. 4 shows a mechanism for generating a gradually amplified voltage, according to exemplary embodiments of the subject matter. The mechanism receives a square wave signal and generates a trapezoid voltage used to gradually amplify transmission from the transmitter, such as transmitter 300. The mechanism 400 receives a signal from a control unit that controls one or more amplifying units via enable transistors. The mechanism may reside between the control unit and the enable transistor, receive signals from the control unit and send gradually increased voltage values to one or more enable transistors. Alternatively, the mechanism 400 may reside in the control unit or in the enable transistors themselves.

The mechanism 400 may include a receiving unit 450, a reversible counter 410, and a transmission unit 430. The mechanism may also comprise a clock 440. The receiving unit 450 receives a signal from the control unit. The signal is a square wave, and may have a value of "1" or "0", or another implementation of "enable" signal or "disable" signal. The reversible counter 410 sums the amount of times an "enable" signal was received at the receiving unit 450 from a control unit. The reversible counter 410 subtracts the number of "disable" signals from the number of "enable" signals. The reversible counter 410 may also subtract a unit from the voltage value provided to the enable transistor in case there is no "enable" signal received from the control unit for a predefined period of time, for example 75 ms. The clock 440 is used to provide indication for the embodiment disclosed above. Transmission unit 430 is used to provide the voltage value determined by the reversible counter 410 to the enable transistor. The trapezoid signal may be a sequence of voltage values determined by the reversible counter 410 or by a processing unit in the mechanism 400. The sequence of values comprises three or more values, such that there are intermediate voltage values received at the enable transistor other than "enable" and "disable". The transmitter may also include a Digital to Analog converter 420 for converting values received from the control unit, or values from a clock unit, into voltage values to be passed to the amplifying unit.

The gradual increase performed by the mechanism 400 provides that the amplification of the signals outputted from the transmitter 300 is gradual. This results in less bandwidth required in the transmitter, and prevents the requirement to use negative voltage. Another result is reducing the load on the electrical appliances in the transmitter.

Figure 5:
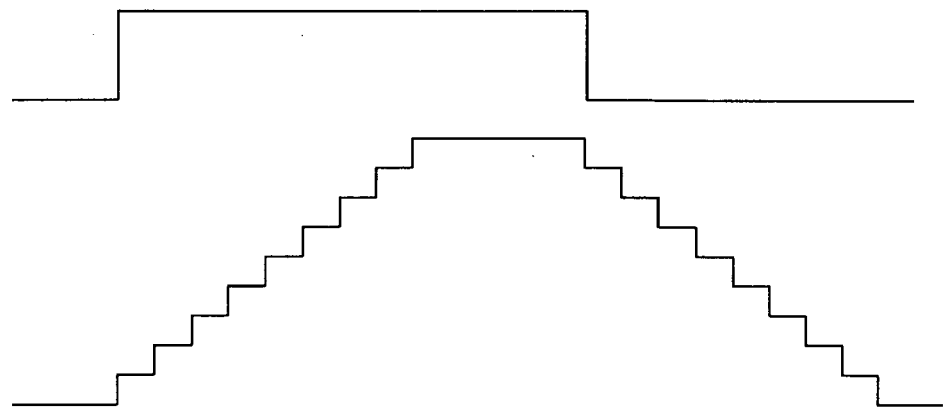
FIG. 5 shows a graph of a gradually amplified signal, according to exemplary embodiments of the subject matter; and, FIG. 6 shows a method of gradually amplifying a signal, according to exemplary embodiments of the subject matter.

FIG. 5 shows a graph of a gradually amplified voltage, according to exemplary embodiments of the subject matter. The graph shows a gradual increase and gradual decrease in the voltage passed to the enable transistor. The value is increased upon indication from a control unit, for example upon receipt of an "enable" signal from the control unit. When receiving an "enable" signal, or in case of receiving an "enable" signal for a predefined duration, such as 10 ms, the value is increased by 1 or by another predefined number. The value may be decreased in a gradual manner upon receipt of a "disable" signal, or upon lack or receipt of an "enable" signal. The value transmitted to the enable transistor within the trapezoid signal may be limited to a predefined value, according to the specification of the transmitter or any module within the transmitter.

Figure 6:
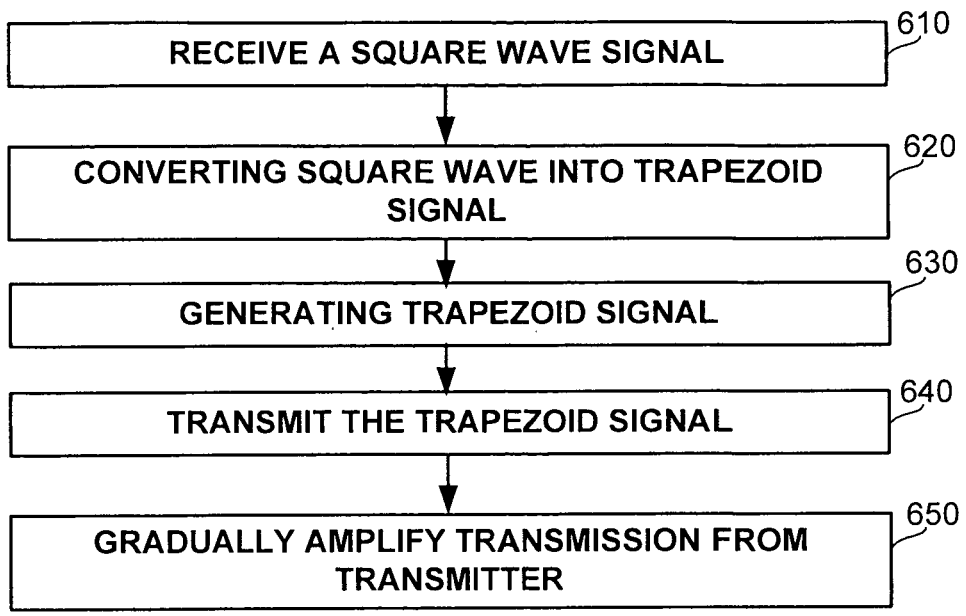

FIG. 6 shows a method of gradually amplifying a signal, according to exemplary embodiments of the subject matter. In step 610, a signal is received from a control unit. The received signal has a characteristic of a square wave, for example having only two values, "enable" and "disable". In step 620, the signal received from the control unit is converted into a trapezoid signal. The trapezoid signal comprises a sequence of values transmitted to the enable transistor. For example, a sequence of values may be [0, 0.1, 0.2, 0.3, 0.4, 0.5, 0.4, 0.5, 0.6, 0.7, 0.7, 0.5, 0.3, 0]. In step 630, the trapezoid signal is generated, for example by a ramping unit, or by a unit residing within the enable transistor. In such case, the trapezoid signal is transmitted from the enable transistor to the common gate transistor or to another module in the amplifier. In step 640, the trapezoid signal is transmitted from the unit that generated the signal. The trapezoid signal may be transmitted from a ramping unit to the enable transistor, or from the enable transistor to the amplifier. In step 650, amplification is performed gradually because the signal is received at the amplifier in gradually increased values. In some exemplary cases, when the impedance value provided from the enable transistor is substantially zero, voltage in the amplifying unit and the common gate transistor is enabled and transmission is enabled. When the impedance is increased, transmission is disabled.

While the disclosure has been described with reference to exemplary embodiments, it will be understood by those skilled in the art that various changes may be made and equivalents may be substituted for elements thereof without departing from the scope of the invention. In addition, many modifications may be made to adapt a particular situation or material to the teachings without departing from the essential scope thereof. Therefore, it is intended that the disclosed subject matter not be limited to the particular embodiment disclosed as the best mode contemplated for carrying out this invention, but only by the claims that follow.

I claim:

1. A method of amplifying a signal, the method comprising:
receiving a command to start transmission; gradually increasing values of multiple enable signals used to amplify the transmission; intermittently transmitting the values of the multiple enable signals to multiple enable transistors used to allow amplifying transmitted signals; wherein each of the multiple enable transistors is coupled in serial to a common source transistor to form multiple pairs of enable transistors and common source transistors; wherein the multiple pairs are coupled in parallel to each other.

2. The method according to claim 1, further comprises a step of generating a trapezoid signal used to gradually increase a value of an enable signal of the multiple enable signals.

3. The method according to claim 2, further comprises a step of converting a square signal into the trapezoid signal.

4. The method according to claim 2, wherein the trapezoid signal is received at the enable transistor.

5. The method according to claim 4 comprising converting the square signal into the trapezoid signal by a ramping unit that resides within the enable transistor.

6. The method according to claim 1, wherein a transmitted value of values that are intermittently transmitted is an impedance value.

7. The transmission unit according to claim 1 wherein an enable transistor of the multiple enable transistors comprises a ramping unit that is arranged to convert a square enable signal into a trapezoid signal.

8. A transmission unit, comprises: an amplifying module, comprising: multiple common source transistors and multiple enable transistors used to allow transmission of signals from the transmission unit; wherein each of the multiple enable transistors is coupled in serial to a common source transistor to form multiple pairs of enable transistors and common source transistors; wherein the multiple pairs are coupled in parallel to each other; wherein each of the enable transistors receives a gradually increased enable signal in an intermittent manner.

9. The transmission unit according to claim 8, further comprising a mechanism for generating a trapezoid signal that is sent to the enable transistor as an enable signal of the enable signals.

10. The transmission unit according to claim 9, further comprising a mechanism for converting a square signal into the trapezoid signal.

11. The transmission unit according to claim 8 wherein a value of each enable signal is only positive.

12. A transmission unit, comprises: an amplifying module, comprising: a common source transistor and an enable transistor used to allow transmission of signals from the transmission unit; wherein the enable transistor receives a gradually increased enable signal in an intermittent manner; wherein the transmission unit, further comprising a reverse counter for detecting signals received from a control unit and an accumulator for summing the number of detected signals.

13. The transmission unit according to claim 12, wherein the detected signals are selected from a group consisting of enable and disable signals.

14. The transmission unit according to claim 12 wherein the reverse counter is arranged to subtract a number of enable signals from a number of disable signals.

15. The transmission unit according to claim 12 wherein the reverse counter is arranged to subtract a unit from a value of the enable signal when the enable signals is not received from a control unit during a predefined period of time.

16. A method of amplifying a signal, the method comprising: receiving a command to start transmission; gradually increasing a value of an enable signal used to amplify the transmission; intermittently transmitting the value of the enable signal to an enable transistor used to allow amplifying a transmitted signal; wherein the gradually generating of the enable signal comprises subtracting by a reversible counter a number of enable signals from a number of disable signals.

17. A method of amplifying a signal, the method comprising: receiving a command to start transmission; gradually increasing a value of an enable signal used to amplify the transmission; intermittently transmitting the value of the enable signal to an enable transistor used to allow amplifying a transmitted signal; wherein the gradually generating of the enable signal comprises subtracting, by a reversible counter, a unit from a value of the enable signal when the enable signal is not received from a control unit during a predefined period of time.

18. A method of amplifying a signal, the method comprising: receiving a command to start transmission; gradually increasing a value of an enable signal used to amplify the transmission; intermittently transmitting the value of the enable signal to an enable transistor used to allow amplifying a transmitted signal; wherein the gradually increasing of the value of the enable signal is responsive to the enable signal that is only of positive values.

* * * * *